United States Patent [19]
Mateja et al.

[11] Patent Number: 5,828,827
[45] Date of Patent: Oct. 27, 1998

[54] DATA PROCESSING SYSTEM FOR PERFORMING A TEST FUNCTION AND METHOD THEREFOR

[75] Inventors: Michael A. Mateja; Tulley M. Peters; Donald L. Tietjen, all of Austin, Tex.

[73] Assignee: Motorola, Inc., Schaumburg, Ill.

[21] Appl. No.: 810,273

[22] Filed: Mar. 3, 1997

Related U.S. Application Data

[63] Continuation of Ser. No. 533,575, Sep. 25, 1995, abandoned.

[51] Int. Cl.[6] ................................... G06F 11/27
[52] U.S. Cl. .................. 315/183.06; 371/22.31
[58] Field of Search ................ 395/183.06; 371/22.1, 371/22.31, 22.32, 22.33, 22.34, 22.35, 22.36, 22.5

[56] References Cited

U.S. PATENT DOCUMENTS

| | | | |
|---|---|---|---|
| 4,703,484 | 10/1987 | Rolfe et al. | 371/22.3 |
| 5,260,948 | 11/1993 | Simpson et al. | 371/22.3 |
| 5,260,950 | 11/1993 | Simpson et al. | 371/22.3 |
| 5,319,646 | 6/1994 | Simpson et al. | 371/22.3 |
| 5,347,520 | 9/1994 | Simpson et al. | 371/22.3 |
| 5,473,617 | 12/1995 | Farwell | 371/22.3 |

*Primary Examiner*—Robert W. Beausoliel, Jr.
*Assistant Examiner*—Scott T. Baderman
*Attorney, Agent, or Firm*—Craig J. Yudell

[57] ABSTRACT

Circuitry is implemented within an integrated circuit ("chip") (101) which is an IEEE 1149.1 compliant device capable of performing JTAG testing (104), such as an EXTEST or CLAMP testing procedure. Upon exiting of either of these procedures, the input/output pins (210) of the chip are placed in a known state, which may be a high impedance state.

6 Claims, 4 Drawing Sheets

FIG. 1 —PRIOR ART—

DATA PROCESSING SYSTEM FOR PERFORMING A TEST FUNCTION AND METHOD THEREFOR

This application is a continuation of prior patent application Ser. No. 08/533,575 filed Sep. 25, 1995, now abandoned.

TECHNICAL FIELD OF THE INVENTION

The present invention relates in general to the testing of integrated circuits, and in particular to the placement of integrated circuit input/output pins in a desired state upon the completion of testing of the integrated circuit.

BACKGROUND OF THE INVENTION

A circuit board may contain numerous integrated circuits (hereinafter referred to as "chips") having numerous input/output ("I/O") pins for interconnecting various internal circuits of the chips. With the continual miniaturization of integrated circuitry, pin numbers on chips have steadily increased. Testing of these interconnections and the associated I/O pins is a vital step in the design and manufacture of such circuit boards and chips.

One of the standards that has been implemented within the industry for testing chips is JTAG (Joint Test Action Group) testing of an IEEE 1149.1 compliant device. (Please refer to IEEE Std. 1149.1, IEEE Standard Test Access Port and Boundary—Scan Architecture, which is hereby incorporated by reference herein.) An IEEE 1149.1 compliant chip has implemented therein control circuitry coupled to each of the I/O pins. Access to this JTAG control circuitry is provided by one or more I/O pins whereby a test device may be coupled for controlling and implementing various testing procedures on the chip. Several of these testing procedures are well-known in the industry, and are often referred to as SAMPLE, EXTEST, CLAMP, HIZ, and BYPASS. While in JTAG EXTEST or CLAMP testing of a chip, the I/O pins may be caused to drive out signals from the chip under test. EXTEST testing generally involves testing an input path into a boundary scan register, or testing an output from a boundary scan register to an external device coupled to an I/O pin, or testing that a switching from input to output or output to input, with respect to a particular I/O pin, functions properly. CLAMP testing generally involves setting all pins on a chip to a known state.

A problem occurs with existing technology in that upon the exiting of either the JTAG EXTEST or CLAMP procedures, the I/O pins of the chip are left in an unknown state. One consequence of this result is that during subsequent testing of a second chip on the circuit board that is coupled to a previously tested first chip having I/O pins left in an unknown state, the unknown signal values being driven from the first chip may affect the test results of the second chip, since these unknown signals are now being provided to the second chip under test.

One prior art technique for placing I/O pins in a deterministic state upon completion of an EXTEST or CLAMP procedure was to maintain an internal clock within the chip to ensure that specified dynamic nodes resolve causing the I/O pins to restore to a specified state. Another prior art solution has been to assert a RESET signal to the JTAG circuitry and to reset the whole board. Yet another prior art solution has been to isolate the bus interconnections between two chips to be tested with external "tristate" devices to isolate one chip from the other with respect to the interconnections. Yet still another prior art solution has been to write such test patterns so that the last test before exiting EXTEST does not drive the outputs, which sets all tristate enabled boundary scan cells to a known drive state.

The problem with the foregoing prior art solutions is that they require either board reset sequences or additional test logic in order to implement.

Thus, there is a need in the art for circuitry on a chip associated with the JTAG testing that leaves the I/O pins of the chip in a deterministic state after exiting JTAG EXTEST or CLAMP testing.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF AN EMBODIMENT OF THE INVENTION

Figure 1:
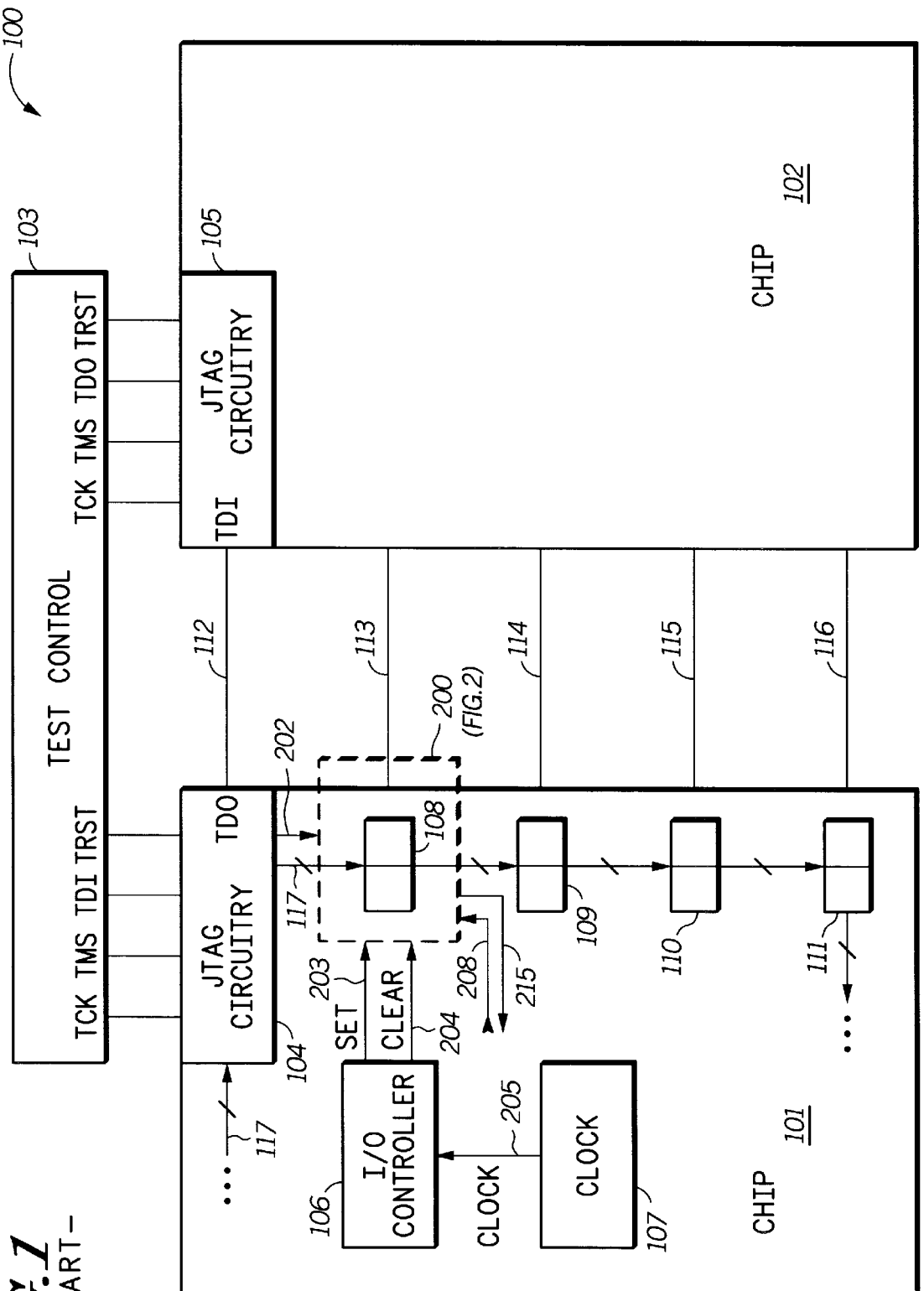
FIG. 1 illustrates two chips on a system board under JTAG testing.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring to FIG. 1, there is illustrated chips 101 and 102 implemented on circuit board 100 and coupled to test control device 103. Chips 101 and 102 are interconnected by transmission lines 112–116. Lines 113–116 are operable for transferring data/address/control information between chips 101 and 102. Transmission line 112 is operable for interconnecting JTAG circuitry 104 to JTAG circuitry 105.

Chips 101 and 102 may contain any well-known logic circuitry, such as a microprocessor or microcontroller. Test control device 103 may comprise any well-known device for conducting JTAG testing of integrated circuits.

Chips 101 and 102 include JTAG circuitry 104 and 105, respectively, which is well-known in the art and is commonly implemented on IEEE 1149.1 compliant devices. Typically, JTAG circuitry 104 is operable for transmitting control and data information along bus 117 through boundary scan registers (only registers 108-111 are shown), which are associated with each of the I/O pins of chip 101. Note, data information may be serially transmitted along bus 117 around the boundary of chip 101 through registers 108–111, while the control information may be directly provided to circuitry, such as circuitry 200, located in association with each I/O pin of chip 101. These connections for the control information may be direct connections and not provided along the boundary of chip 101 in a serial manner. After such information has traveled around the I/O connections of chip 101, the signal is returned to JTAG circuitry 104. This foregoing configuration is well-known in the art.

JTAG circuitry 104 and 105 are coupled to test control device 103 by various I/O connections. One of the connections is TCK, which is a clock signal that is provided to JTAG circuitry 104, 105 by test control device 103. Interconnection TDI represents a test data in signal for supplying test data from test control device 103 to JTAG circuitry 104. TRST represents a test reset signal that may be provided from test control device 103 to JTAG circuitry 104, 105. TDO represents a connection between test control device 103 and JTAG circuitry 105, whereby test control device 103 receives data information from JTAG circuitry 105, which has been received along line 112 from JTAG circuitry 104 for tests that involve such a passing of information.

Various tests may be controlled by test control device 103 for testing chip 101. For example, a SAMPLE test may be conducted whereby each of the I/O pins of chip 101 is sampled by JTAG circuitry 104. Another test is the HIZ test, which places each of the I/O pins into a high impedance state. Another test that may be implemented is the BYPASS test whereby a test data signal is provided from test control device 103 to JTAG circuitry 104 and is then directly outputted from JTAG circuitry 104 via a TDO (test data out) I/O pin through transmission line 112 to the TDI pin in JTAG circuitry 105. In this test, the internal testing circuitry on chip 101 is actually bypassed and test data is supplied to JTAG circuitry 105 (for distribution and testing of chip 102) through JTAG circuitry 104.

The clamp and EXTEST tests have been discussed above.

Hereinafter, reference will be made solely to the EXTEST. However, the following discussion also applies to the CLAMP test.

Chip 101 also includes I/O controller 106, which provides a SET signal on line 203 to circuit 200 and a CLEAR signal on line 204 to circuit 200. I/O controller 106 and the associated SET and CLEAR signals are typical within an integrated circuit implemented on a chip. The SET and CLEAR signals are control signals for controlling the driving and receipt of information at I/O pin 210 during normal operation of chip 101. I/O controller 106 is supplied with an internal CLOCK signal on line 205 from clock circuit 107. Clock circuit 107 provides the internal CLOCK signals required by chip 101 for proper functioning during normal operation. During JTAG testing, JTAG circuitry 104 typically disables the internal clock in chip 101. This results in the SET and CLEAR signals being forced to inactive states (a logical '0'). Any clocking required during JTAG testing within chip 101 may be supplied by the TCK clock signal discussed previously.

Figure 2:
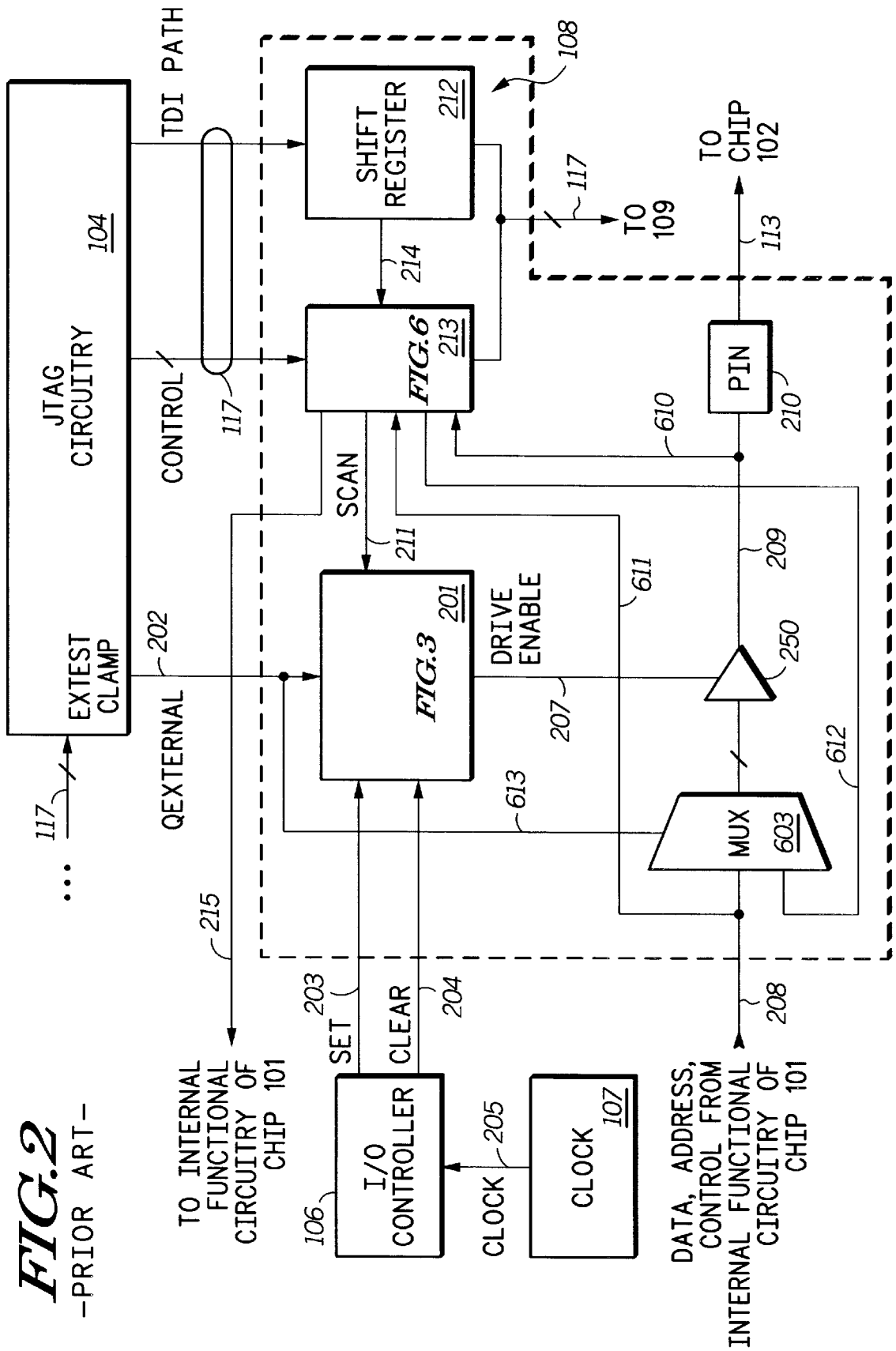
FIG. 2 illustrates a more detailed diagram of the JTAG testing circuitry in chip 101 of FIG. 1.

Referring next to FIG. 2, there is illustrated a more detailed diagram of a portion of chip 101 as previously illustrated in FIG. 1. Circuit 200 includes driver circuit 250, which receives data, address, or control information from the internal circuitry of chip 101 on line 208. If driver 250 is enabled, then this received information will be driven on line 209 through chip pin (pad) 210 onto transmission line 113 to chip 102. If driver circuit 250 is not enabled, then the foregoing information will not be driven, and instead the output of driver circuit 250 will be placed into a high impedance state (commonly referred to as a tristate condition). The enabling and disabling of driver circuit 250 is performed by circuit 201, which is coupled to driver circuit 250 by connection 207. The internal circuitry of circuit 201 is further described below with respect to FIG. 3.

Circuitry 108 is comprised of shift register 212, which is along the test data (TDI) path originating in JTAG circuitry 104, while circuitry 213 receives control data from JTAG circuitry 104. As discussed above, the control information supplied to circuitry 213 may be provided in a serial manner as is the TDI data information on bus 117, or the control information may be supplied to circuitry 213 by a separate bus coupled to all similar circuitry throughout chip 101, or the control information from JTAG circuitry 104 to circuitry 213 may be supplied in a point-to-point manner. The internal configuration of circuitry 213 is further discussed below with respect to FIG. 6.

Primarily, circuitry 213 receives control information from JTAG circuitry 104 and data information from shift register 212 by shifting along line 214 in order to provide the SCAN signal on line 211 to circuitry 201.

Furthermore, the furtherance of the serial TDI data to register 109 may be performed through circuit 213. In other words, the TDI path passes through shift register 212 along path 214 to circuit 213 and is outputted back on to path 117. This is further illustrated below in FIG. 6.

Circuit 201 also receives from JTAG circuitry 104 a QEXTERNAL signal on line 202. The QEXTERNAL signal is essentially a mode enable signal for the EXTEST and CLAMP tests. The function of this QEXTERNAL signal is further described below.

While in a JTAG EXTEST test procedure, driver circuit 250 may be driving out a specified signal. Within prior art circuits, when the EXTEST test was completed and exited by JTAG circuitry 104, output driver circuit 250 was often not turned off. The problem is that this leaves the state on transmission line 113 uncertain as to what value resides on line 113. A goal of the present invention is to place line 113 in a deterministic state after exiting JTAG EXTEST. This provides a device which causes no bus contention on line 113 when testing of both chips 101 and 102 is to be performed.

The present invention is compliant with the IEEE 1149.1 standard. With the present invention, the TRST reset signal is not required, and thus this pin is not needed. This may provide an extra I/O pin for the internal logic of a chip. Such I/O pins are very valuable. With the present invention, internal clock 107 is disabled. The active clock is the TCK clock.

Figure 3:
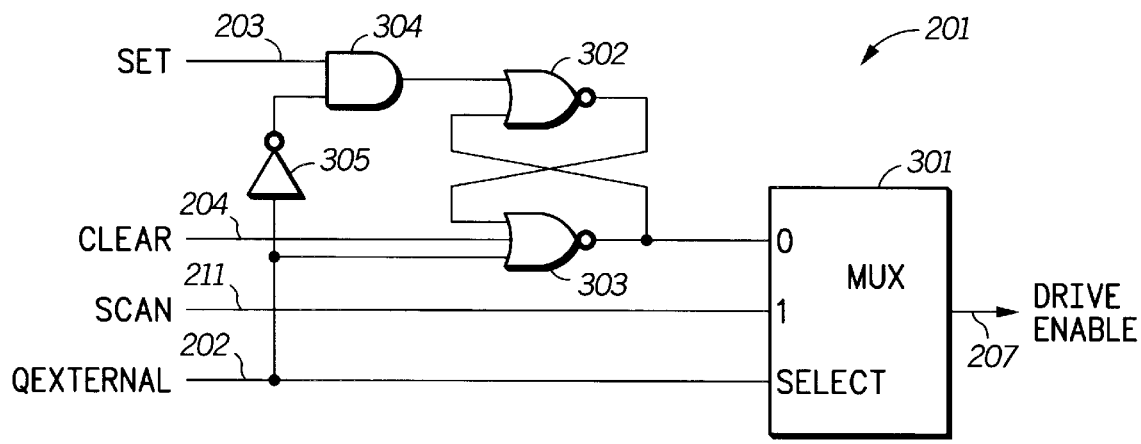
FIG. 3 illustrates an embodiment of the present invention.

Referring next to FIG. 3, there is illustrated an embodiment of circuit 201 of FIG. 2. The output signal DRIVE ENABLE will cause driver circuit 250 to drive I/O pin 210 with a specified signal (1 or 0) when this signal is high on line 207. When the DRIVE ENABLE signal is low, it will cause the output of driver 250 to a tristate condition. The input signal SCAN on line 211 is the output drive state control bit. A high SCAN signal corresponds to the driving of an output signal onto line 113. The input signal QEXTERNAL on line 202 is the EXTEST and CLAMP mode signal. When it is high, it signals that one of these two tests is being conducted. The SET signal on line 203 and the CLEAR signal on line 204 are functional signals from I/O controller 106 to control driver 250 during normal operation of chip 101 (when not in JTAG test mode).

The circuit diagram in FIG. 3 is only one of many circuit implementations possible for implementing the functionality of the present invention. One skilled in the art would be able to vary this design with various alternative logic circuits.

The QEXTERNAL signal is provided to the SELECT input of multiplexor circuit 301 for selecting between the 0 and 1 inputs to multiplexor circuit 301 for output on line 207 as the DRIVE ENABLE signal. When QEXTERNAL is high, then the 1 input will be selected. When QEXTERNAL is low, the 0 input will be selected to be outputted on line 207. An inverting latch circuit comprising NOR devices 302 and 303 is coupled to the 0 input of multiplexor circuit 301. One of the inputs to NOR device 302 is coupled to the output of AND logic device 304, which has one of its inputs coupled to line 203 where the SET signal is delivered. The other input to AND circuit 304 is coupled to the output of inverter circuit 305, which receives the QEXTERNAL signal.

One of the inputs to NOR device 303 also receives the QEXTERNAL signal, while another input to device 303 receives the CLEAR signal on line 204.

During normal operation when the EXTEST is not being performed by JTAG circuitry 104, the QEXTERNAL signal will be low resulting in multiplexor 301 outputting on line 207 the signal received in input 0. QEXTERNAL being low results in a high signal into the second input of AND circuit 304, which results in the passing of the SET signal to one of the inputs to NOR device 302. The LOW signal for QEXTERNAL also supplied to one of the inputs to NOR device 303 allows for the CLEAR signal supplied to another one of the inputs to NOR device 303 to be evaluated by device 303.

Figure 4:
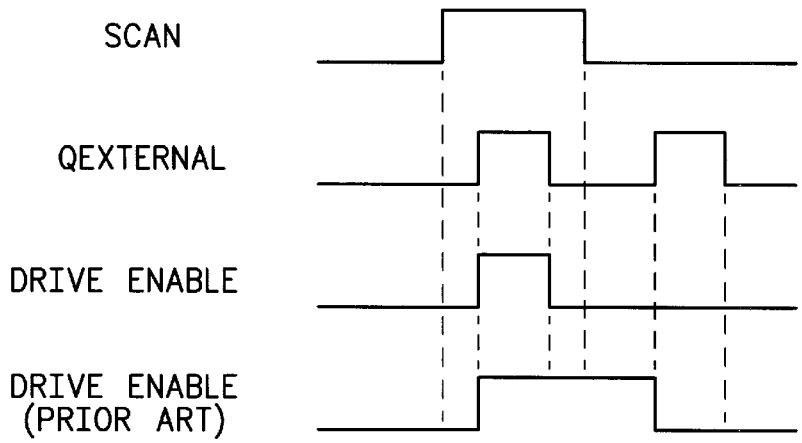
FIG. 4 illustrates a timing diagram in accordance with the present invention.

When QEXTERNAL is high, then the 1 input to multiplexor 301 will be passed on to the output on line 207. This 1 input is coupled to the SCAN signal on line 211. Referring next to FIG. 4, there is illustrated a timing diagram showing the operation of the signals. Essentially, the QEXTERNAL signal determines what signal is outputted as the DRIVE ENABLE signal. If the SCAN signal is high when QEXTERNAL goes high, then the DRIVE ENABLE signal will be high during the period of time that the QEXTERNAL signal is high. Likewise, if the SCAN signal is low when the QEXTERNAL signal is high, then the DRIVE ENABLE signal will be low during this period when the QEXTERNAL signal is high. Thus, when the EXTEST is being performed (QEXTERNAL high), a specified signal provided from shift register 112 from JTAG circuitry 104 is supplied to output pin 210 as desired by the EXTEST. When the EXTEST is exited (QEXTERNAL low), then the DRIVE ENABLE signal is caused to go low, resulting in a high impedance state on the output of driver 250. Thus, the circuit in FIG. 3 places I/O pin 210 in a deterministic state after exiting a JTAG EXTEST procedure such that this output is now in a high impedance state. This also results in no bus contention problems with respect to interconnection 113 between chips 101 and 102.

Regardless of the signal state provided to multiplexor circuit 301 on the 0 input, this signal state will not be passed on as the DRIVE ENABLE signal upon exiting of the EXTEST procedure. This is desired since this signal state provided to input 0 may become unknown during the JTAG EXTEST procedure within prior art devices. The feed forward of the QEXTERNAL signal to the latch comprising devices 302 and 303 ensures that this unknown signal does not pass on to line 207 upon exiting of the EXTEST procedure. This is so because the high QEXTERNAL signal supplied to device 303 ensures that NOR device 303 is outputting a logical low signal (a known state) upon exiting of the EXTEST. In an alternative embodiment, a logical high signal (still a known state) may be supplied to the 0 input of mux 301 for output onto line 207. Note that the SET and CLEAR signals are low during an EXTEST since JTAG circuitry 104 disables internal clock 107.

Figure 5:
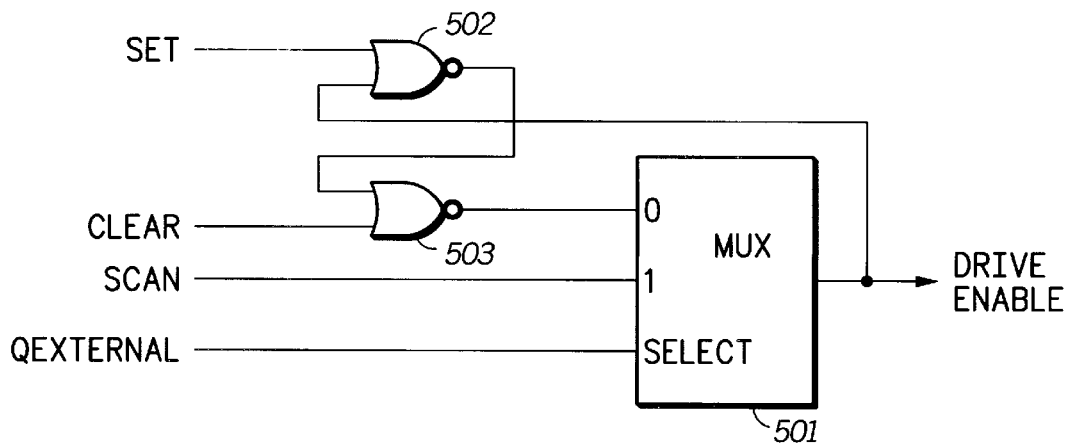
FIG. 5 illustrates a prior art circuit.

Referring next to FIG. 5, there is illustrated a prior art implementation of circuit 201, which implements a latch comprising NOR devices 502 and 503 receiving the SET and CLEAR signals, wherein NOR device 502 receives feedback from the output of multiplexor 501. The QEXTERNAL signal is not supplied in a feed forward manner to this latch, but is instead merely supplied to the SELECT input of multiplexor circuit 501. The result of the operation of this prior art circuit is illustrated by the last line in the timing diagram in FIG. 4 wherein the DRIVE ENABLE signal does not go low when the QEXTERNAL signal is removed, signalling the end of the EXTEST. Not until the QEXTERNAL signal goes high again is this DRIVE ENABLE signal modified. Thus, if an EXTEST is exited using this prior art device, then driver 250 may end up driving some unknown signal for an indefinite amount of time after exiting of the EXTEST, which is not a desirous situation.

Figure 6:
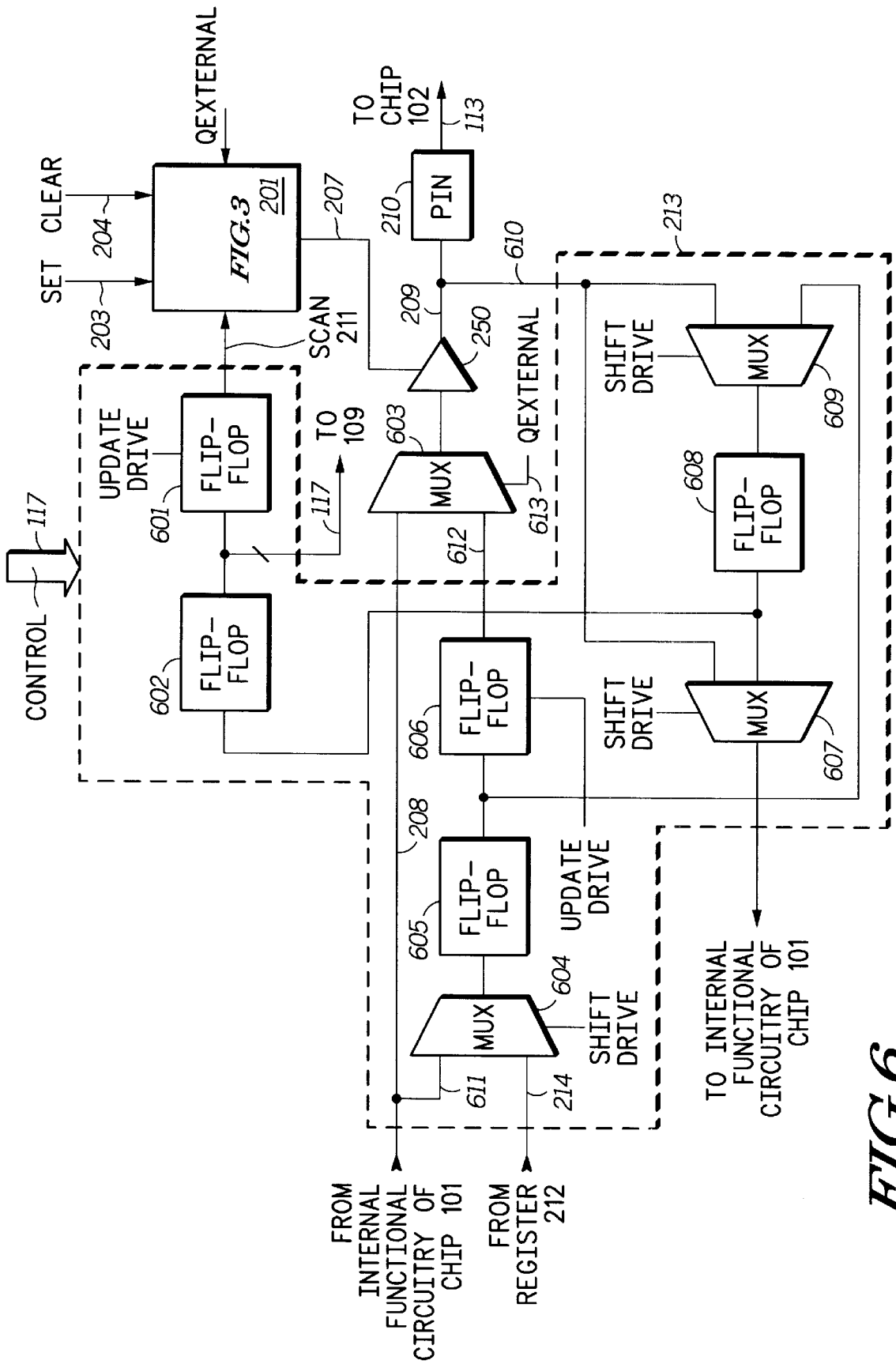
FIG. 6 illustrates a more detailed diagram of an implementation of circuit 213.

Referring next to FIG. 6, there is illustrated a more detailed diagram of a possible embodiment of circuit 213. Circuit 213 receives control information on bus 117, data information on line 214, is coupled to lines 208 and 209, may output TDI data onto bus 117, and may supply data received at pin 210 to the internal functional circuitry of chip 101, as during normal operation of chip 101.

Line 214 is supplied to one input of mux 604, which has its other input 611 coupled to line 208. The operation of mux 604 is controlled by control signal SHIFTDR. The output of mux 604 is coupled to flip-flop 605, which has its output coupled to flip-flop 606 and to one of the inputs to mux 609. Flip-flop 606 has its output 612 coupled to one of the inputs of mux 603. The operation of flip-flop 606 is dependent upon the receipt of control signal UPDATEDR. Mux 603 also receives an input from line 208. Mux 603 is controlled by the QEXTERNAL signal received on line 613. The output of mux 603 is provided to driver circuit 250. During normal operation of chip 101, the QEXTERNAL signal supplied on line 613 to mux 603 will select the input coupled to line 208 to pass data, address, or control information from the internal functional circuitry of chip 101 to pin 210 through driver circuit 250. During an EXTEST test, when the QEXTERNAL signal is high, it will select the input coupled to line 612 for passage on to driver circuit 250.

Line 209, which is coupled to the output of driver circuit 250, is coupled to line 610, which is coupled to an input to mux 607 and an input to mux 609. The output of mux 609 is coupled to flip-flop 608, which has its output coupled to the other input to mux 607. Additionally, the output of flip-flop 608 is coupled to the input to flip-flop 602. Mux 607 and mux 609 are controlled by control signal SHIFTDR.

The output of mux 607 is coupled to line 215, which is coupled to the internal functional circuitry of chip 101.

The output of flip-flop 602 is coupled to flip-flop 601 and to bus 117. The passage of information from flip-flop 601 to circuitry 201 is controlled by control signal UPDATEDR. This output is referred to above as the SCAN signal.

Serial data received from the TDI path into shift register 212 may be passed to mux 604 along line 214. Control signal SHIFTDR will select this input to pass the serial data on to flip-flop 605, which passes the serial data on to flip-flop 606 and mux 609. The SHIFTDR signal will also pass the serial data on to flip-flop 608 and to flip-flop 602. Essentially, a state machine within JTAG circuitry 104 for controlling the control signals SHIFTDR and UPDATEDR operate to insert the received serial data into flip-flops 605, 608 and 602, in that order. The data in flip-flop 602 will be operable for controlling circuitry 201. Depending upon this data, the data in flip-flop 605 may be outputted by driver circuit 250 on to pin 210. Often, it does not matter what data is within flip-flop 608. What may be more important, is what data is received by flip-flop 608 from pin 210, which may be coupled to some external device during the testing procedure. This received information may then be passed to the internal functional circuitry of chip 101 on line 215. This would test the I/O connection associated with pin 210 to insure that it will properly receive data on pin 210 for passage on to the internal functional circuitry of chip 101. The connections associated with pin 210 and the ability of driver circuity 250 to accurately drive a signal is tested by the output of data supplied to flip-flop 605. This data is passed on to flip-flop 606 and mux 603 in response to control signals UPDATEDR and QEXTERNAL. Thus, through these control signals, the outputting of a specified data bit can be tested with the QEXTERNAL test by controlling what data is supplied to driver circuit 250 and when this data is driven by driver circuit 250.

An example operation would be the serial input of bits to flip-flops 605, 608, and 602, in that order, with control signal SHIFTDR. Once this serial information is in place, then a test of the output of data by driver circuit 250 out to pin 210 may be conducted through the use of the control signal UPDATEDR for controlling flip-flops 601 and 606. As described above, when exiting the EXTEST test, prior art circuits did not provide for a deterministic output from driver circuit 250 on line 209, which is coupled to pin 210. The present invention provides that upon exiting of the EXTEST test, it will be known whether or not the output of driver circuit 250 is driving a 1, a 0, or is in a high impedance state.

Variations of the above circuit 213 may be implemented by one skilled in the art, as long as the primary function of predetermining the output state of driver circuit 250 upon the exiting of an EXTEST test is implemented.

Although the present invention and its advantages have been described in detail, it should be understood that various changes, substitutions and alterations can be made herein without departing from the spirit and scope of the invention as defined by the appended claims.

What is claimed is:

1. An integrated circuit comprising:
   circuitry operable for conducting a test in said integrated circuit; and
   circuitry in the integrated circuit operable for placing an input/output ("I/O") port of said integrated circuit in a high impedance state upon completion of said test, wherein said I/O port is an output of a driver circuit in the integrated circuit operable for driving signals on said I/O port, and wherein said circuitry for placing said I/O port in said high impedance state sends a control signal to said driver circuit signaling said driver circuit to place said I/O port in said high impedance state, and further wherein said circuitry operable for placing the I/O port in a high impedance state includes:
   a multiplexor having an output coupled to said driver circuit, said output operable for sending said control signal, said multiplexor operable for receiving a mode control signal and a scan signal from said circuitry for conducting said test in said integrated circuit, said mode control signal indicating that said test is being performed and signaling said multiplexor to select said scan signal, and
   a latch circuit coupled to an input of said multiplexor, said latch circuit operable for receiving said mode control signal and additional input signals and said latch circuit being set in a deterministic state in response to said mode control signal and independent of said additional input signals such that, upon completion of said test, said output sends said control signal to said driver circuit signaling said driver circuit to place said I/O port in s aid high impedance state.

2. The integrated circuit as recited in claim 1, wherein said control signal sent to said driver circuit is dependent upon said scan signal and said mode control signal.

3. A processor comprising:
   an I/O port;
   a driver circuit operable for driving a data signal to said I/O port;
   circuitry operable for controlling said driver circuit;
   circuitry operable for conducting a test in said processor, including a multiplexor having an output coupled to said driver circuit, wherein said multiplexor is operable for receiving at a select input of said multiplexor a test mode signal operable for causing said multiplexor to select between a test signal input and a data input, wherein said test signal causes said driver circuit to drive a signal to said I/O port; and
   circuitry in the processor, coupled to said circuitry operable for controlling said driver circuit, operable for placing said I/O port of said processor in a high impedance state upon completion of said test wherein said I/O port assumes the high impedance state in response to said output when said test mode signal causes said multiplexor to select said data input of said multiplexor.

4. The processor as recited in claim 3, wherein said test is an EXTEST test.

5. The processor as recited in claim 3, wherein said test is a CLAMP test.

6. The processor as recited in claim 3, wherein said processor is IEEE 1149.1 compliant.

* * * * *